US007096180B2

(12) United States Patent
Waltho

(10) Patent No.: US 7,096,180 B2
(45) Date of Patent: Aug. 22, 2006

(54) METHOD AND APPARATUSES FOR IMPROVING QUALITY OF DIGITALLY ENCODED SPEECH IN THE PRESENCE OF INTERFERENCE

(75) Inventor: Alan E. Waltho, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 352 days.

(21) Appl. No.: 10/146,866

(22) Filed: May 15, 2002

(65) Prior Publication Data

US 2003/0216910 A1 Nov. 20, 2003

(51) Int. Cl.

*G10L 19/04* (2006.01)
*G10L 19/14* (2006.01)
*G10L 21/04* (2006.01)
*H03M 7/36* (2006.01)

(52) U.S. Cl. ......................... 704/212; 704/229; 341/77

(58) Field of Classification Search ................ 704/201, 704/212, 226, 228, 229; 370/473, 479; 341/77
See application file for complete search history.

(56) References Cited

U.S. PATENT DOCUMENTS 4,359,603 A * 11/1982 Heaton ....................... 370/267
4,455,649 A * 6/1984 Esteban et al. ............. 370/522
4,622,680 A * 11/1986 Zinser ........................ 375/245
4,952,193 A 8/1990 Talwar
4,989,246 A * 1/1991 Wan et al. .................. 704/212
5,428,831 A 6/1995 Monzello et al.
5,978,762 A * 11/1999 Smyth et al. ............... 704/229
6,104,991 A * 8/2000 Newland et al. ............ 704/212
6,343,217 B1 * 1/2002 Borland ...................... 455/462
6,477,502 B1 * 11/2002 Ananthpadmanabhan et al. .......................... 704/503
6,567,056 B1 5/2003 Waltho
6,584,438 B1 * 6/2003 Manjunath et al. ......... 704/228
6,633,840 B1 * 10/2003 Bonnard et al. ............ 704/229
6,708,147 B1 * 3/2004 Mekuria et al. ............ 704/228
6,757,654 B1 * 6/2004 Westerlund et al. ........ 704/262

(Continued)

FOREIGN PATENT DOCUMENTS

EP 0905914 A2 3/1999

(Continued)

OTHER PUBLICATIONS

Lee et al., "A Performance Study of Delta Modulation Systems for Voiceband Data Signals," IEEE Transactions on Communications, Sep. 1981, vol. 29, Issue 9, pp. 1324 to 1329.*

(Continued)

*Primary Examiner*—Martin Lerner
(74) *Attorney, Agent, or Firm*—Blakely, Sokoloff, Taylor & Zafman LLP

(57) ABSTRACT

Methods and apparatuses for encoding speech signals in the presence of interference that accurately establishes a speech signal value subsequent to lost transmission packets. For one embodiment of the present invention, the initial bits of a speech transmission packet are encoded using a PCM encoding scheme and the remaining bits are encoded using a CVSD encoding scheme. Upon encoding, the initial bits of each packet, the instantaneous value of the voltage as derived from CVSD coder/decoder at the transmitter is encoded using PCM coding rather than CVSD coding. At the receiver, each packet is decoded independently using the PCM-encoded bits, rather than the terminal value of a preceding packet, to define a starting value. The PCM encoded bits of a valid packet are used to reestablish the signal value, thus avoiding packet-to-packet error extension in the presence of burst interference.

20 Claims, 4 Drawing Sheets

U.S. PATENT DOCUMENTS

| | | | | |
|---|---|---|---|---|
| 6,771,931 | B1 | 8/2004 | Waltho | |
| 2003/0182107 | A1 * | 9/2003 | Chan | 704/212 |
| 2004/0102969 | A1 * | 5/2004 | Manjunath et al. | 704/229 |
| 2005/0069063 | A1 | 3/2005 | Waltho | |

FOREIGN PATENT DOCUMENTS

| | | | |
|---|---|---|---|
| WO | WO-02/103922 | A1 | 12/2002 |
| WO | WO-2005/034377 | A1 | 4/2005 |

OTHER PUBLICATIONS

Jeong et al., "A PCM/ADM and ADM/PCM Code Converter," IEEE Transactions on Acoustics, Speech, and Signal Processing, Dec. 1979, vol. 27, Issue 6, pp. 762 to 768.*

* cited by examiner

110

| TIME | TRANSMIT |
|---|---|
| $T_0$ | SIGNAL |
| $T_1$ | 1 |
| $T_2$ | 0 |
| $T_3$ | 0 |
| $T_4$ | 0 |
| $T_5$ | 1 |

METHOD AND APPARATUSES FOR IMPROVING QUALITY OF DIGITALLY ENCODED SPEECH IN THE PRESENCE OF INTERFERENCE

FIELD

Embodiments of the invention relates generally to the field of packet-switched voice transmission, and more particularly to an improved method of encoding speech signals for systems subject to burst errors.

BACKGROUND

Of the available speech digitization techniques, one of the more popular is the waveform follower technique that attempts to emulate the speech waveform. Although the waveform follower technique requires more transmission bandwidth than other techniques, it has been preferred due to its simple implementation architecture and low processing and power requirements. Two types of waveform follower speech signal encoding techniques are pulse code modulation (PCM) and continuously variable slope delta modulation (CVSD). PCM, which is basically a quantized pulse amplitude modulation, obtains an adequate representation of an analog signal by sampling the signal and encoding each sample as an approximation to one of several allowable discrete values. A typical PCM technique samples the analog speech signal 8000 times per second. Each sample is represented by 8 bits for a total bit rate requirement of 64 Kbps.

In contrast, CVSD does not encode each signal sample approximation, but instead encodes discrete increments of the signal, relative to the previous sample approximation. FIG. 1A illustrates a CVSD digital transmission scheme in accordance with the prior art. As shown in FIG. 1A, analog signal 105 is sampled six times, namely $t_0$–$t_5$. The initial value at $t_0$ is the reference value for the next subsequent sample. Subsequent increases in the value of the signal are encoded as a 1, whereas subsequent decreases in the signal are encoded as a 0. At $t_1$ the signal has increases from $t_0$ and therefore a 1 is transmitted. At $t_2$ the signal has decreased from $t_1$ and therefore a 0 is transmitted, and so on. CVSD encoding chart 110 illustrates the encoding of signal 105. The signal can then be reconstructed by increasing the value of the reconstructed signal in response to a 1 being received, and decreasing the reconstructed signal in response to a 0 being received. Because CVSD does not transmit each approximate signal sample, but only a relative change in the signal, CVSD requires a significantly lower bit rate than PCM. A typical CVSD technique requires a bit rate of 32 Kbps. In the radio domain, where bandwidth is a concern, CVSD has been preferred over PCM because CVSD provides equivalent speech quality with approximately half the bit rate requirement. Additionally, for radio, a baseline of about 16 Kbps is typically considered sufficient to provide adequate quality, so CVSD provides more than adequate quality.

The use of CVSD, however, presents a drawback for systems subject to burst errors. From FIG. 1A, it can be appreciated that CVSD depends heavily on previous data to accurately reconstruct a signal. For bust errors (burst interference), an entire packet data, or more, may be corrupted at one time. This means that some previous data, which the CVSD scheme depends so heavily upon, may be lost. CVSD speech encoding is subject to error extension and severe loss of speech quality when subject to losses of packets. FIG. 1B provides an illustration of the effect of a burst error on signal recovery using CVSD. Signal 110 suffers a burst error from time $t_3$–$t_6$. At time $t_6$ the reference to the signal has been established. The reconstruction of the signal using CVSD compares the signal at $t_3$ (0) to the signal $t_6$(−1). Since the value at $t_6$ is lower, the CVSD scheme sends the reconstructed signal lower. The value of the signal at time $t_7$ (0) and the value of the reconstructed signal at time $t_7$, (−2) is now totally distorted. The distortion continues at $t_8$ and $t_9$, and may continue from one packet to another. Due to gaps, typical in speech signals, there is a tendency for the signal to revert to zero periodically which is eventually ends the error propagation.

Systems that employ frequency hopping are prone to burst errors. Frequency hopping may be employed where multiple systems are in use in relatively small area. Each device randomly hops from one frequency to another until a frequency is found that is not in use by some other device at the time. The device may then use the frequency to communicate for a short time before hopping to another available frequency. Thus, the problem of trying to assign a designated frequency for to each device in a dynamic (e.g., mobile) environment is avoided. However, because the hopping is random, there are instances where two or more devices have selected the same frequency causing mutual interference.

The short-range networking protocol Bluetooth is an example of a frequency-hopping system. Bluetooth hops over a frequency band of 2.402 GHz to 2.48 GHz in 1 MHz increments for a total of 79 channels. The Bluetooth protocol provides for frequency hopping at the rate of 1600 hops per second with 64 bits of data in each hop.

Frequency hopping wireless systems operating in a congested RF environment such as Bluetooth may address the problem of interference with a data transmission by requesting a retransmission, however to maintain quality speech transmissions, the delay associated with retransmission must be avoided. Such systems must be able to extrapolate across lost packets.

BRIEF DESCRIPTION OF THE DRAWINGS

Embodiments of the present invention are illustrated by way of example, and not limitation, by the figures of the accompanying drawings in which like references indicate similar elements and in which.

DETAILED DESCRIPTION

An embodiment of the present invention provides a method for accurately establishing a speech signal value subsequent to lost transmission packets. An embodiment of the invention can be implemented via a speech data transmission packet (packet) as used in Bluetooth and other frequency hopping wireless networks. For one embodiment of the present invention, a packet is encoded using an encoding technique wherein a predetermined number of initial bits are encoded using a PCM encoding scheme and the remaining bits are encoded using a CVSD encoding scheme. Upon encoding the initial bits of each packet, the instantaneous value of the voltage as derived from CVSD coder/decoder at the transmitter is encoded using PCM coding rather than CVSD coding.

At the receiver, each packet is decoded independently using the PCM-encoded bits to define a starting value, rather than using the end value of a preceding packet. That is, the PCM-encoded initial bits of each packet are used to define the value of the speech sample at the beginning of each packet, which the subsequent CVSD-encoded bits will reference. If the system experiences a burst error, the PCM encoded bits of a subsequent, valid, packet are used to reestablish the signal value, thus avoiding packet-to-packet error extension.

An embodiment of the present invention may be implemented via a software algorithm that encodes initial bits of each speech transmission packet as PCM and encodes the remaining bits of the packet as CVSD.

In the following detailed description of exemplary embodiments of the present invention, numerous specific details are set forth in order to provide a thorough understanding of the described embodiments of the present invention. However, it will be apparent to one skilled in the art that alternative embodiments of the present invention may be practiced without these specific details. In some instances, well-known structures and devices are shown in block diagram form, rather than in detail, in order to avoid obscuring the description of exemplary embodiments of the present invention.

Figure 1A:
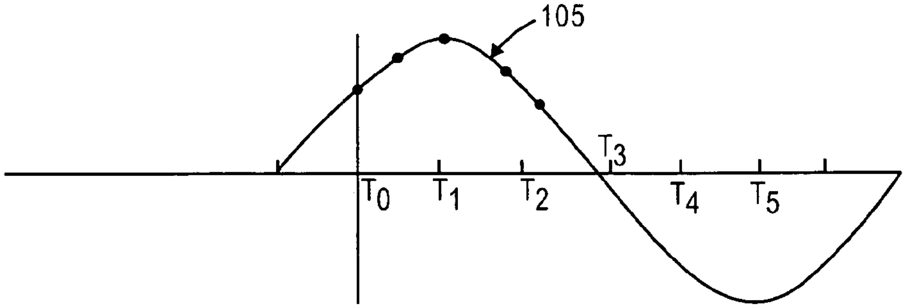
FIG. 1A (PRIOR ART)
FIG. 1A illustrates a CVSD digital transmission scheme in accordance with the prior art.
Figure 1B:
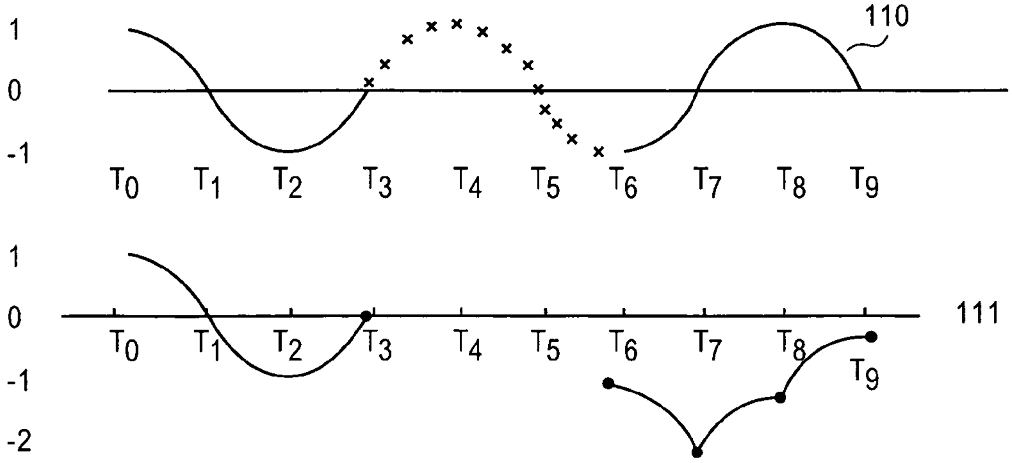
FIG. 1B (PRIOR ART)
FIG. 1B provides an illustration of the effect of a burst error on signal recovery using CVSD.
Figure 2:
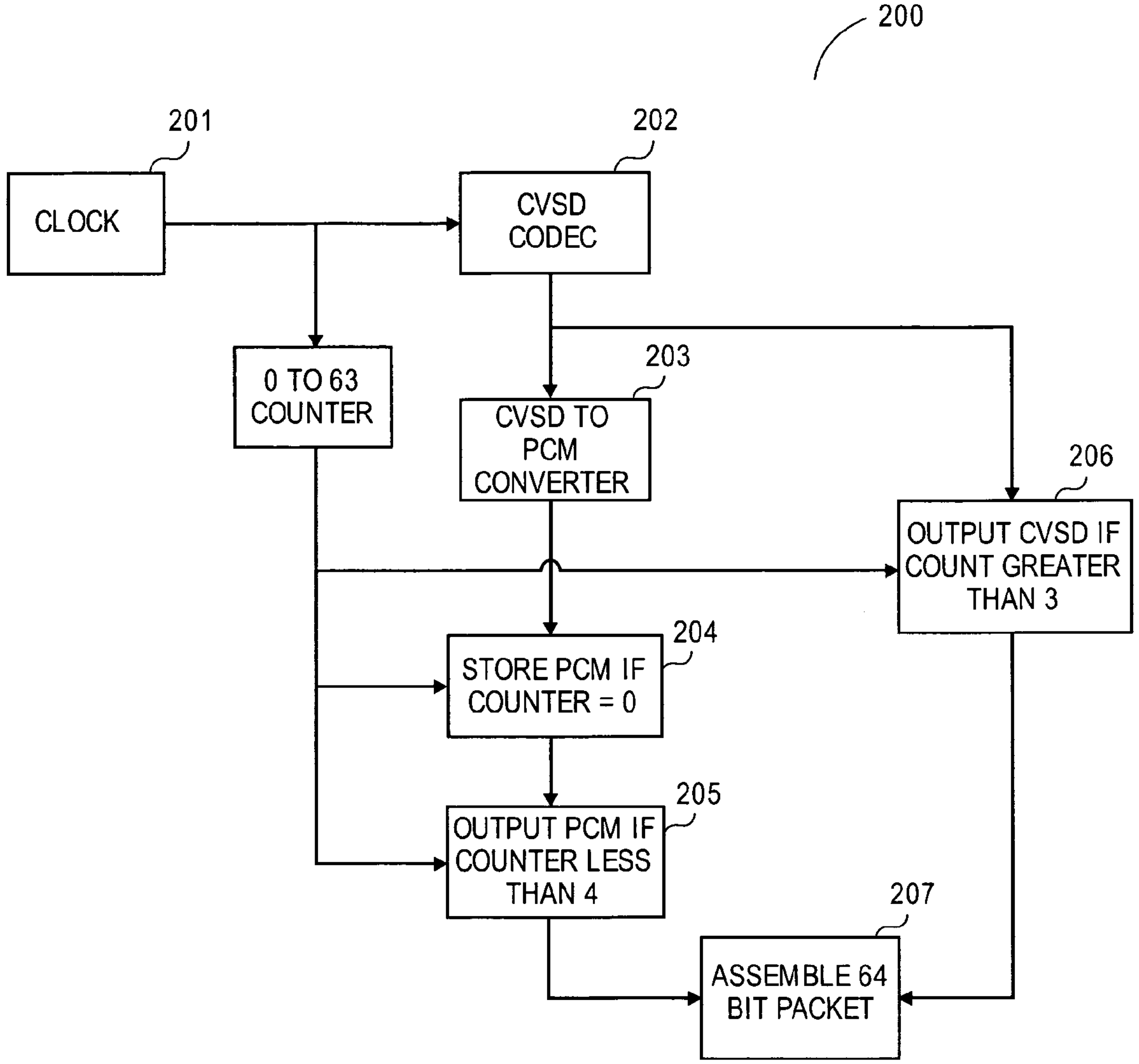
FIG. 2 illustrates a functional block diagram of the encoder/transmitter for encoding a speech signal in accordance with an embodiment of the present invention.

FIG. 2 illustrates a functional block diagram of the encoder/transmitter for encoding a speech signal in accordance with an embodiment of the present invention in which the system employs a 64-bit packet, with four initial bits encoded as PCM.

The system 200, shown in FIG. 2 provides a clock signal to a CVSD coder/decoder (codec) and a counter at operational block 201. The counter is set for the number of bits in a transmission packet (e.g., 64).

At operational block 202, the codec converts the input analog signal to digital form (in this case using the CVSD encoding scheme). At transmission the error-free speech signal is available and can be CSVD-encoded without risk of error propagation.

At operation block 203 the CVSD bits are converted to PCM bits. The signal has been encoded as CVSD on a continuous, error-free, basis and therefore, the waveform can be recreated and the PCM values determined. That is, a CVSD-encoded analog waveform is used to determine the PCM bit values. At operational block 204 PCM bits are stored when the counter is reset.

PCM bits are used to assemble a data packet when the counter is less than four at operational block 205. That is, the initial four bits of the packet will be PCM-encoded bits. The number of bits encoded as PCM depends upon the packet size and quality requirements of the particular system.

When the counter is greater than three at operational block 206, the CSVD bits are output to packet assembly. The 64-bit packet is assembled using four initial PCM-encoded bits and 60 CVSD-encoded bits at operational block 207. With such a packet construction, the value of the analog signal at the beginning of each packet may be established using the initial PCM-encoded bits while the remaining CVSD-encoded bits provide the benefit of a relatively low bit rate requirement. For a system using a 64 bit packet, it has been determined empirically that three PCM-encoded bits is sufficient for establishing the value of an analog speech signal.

Figure 3:
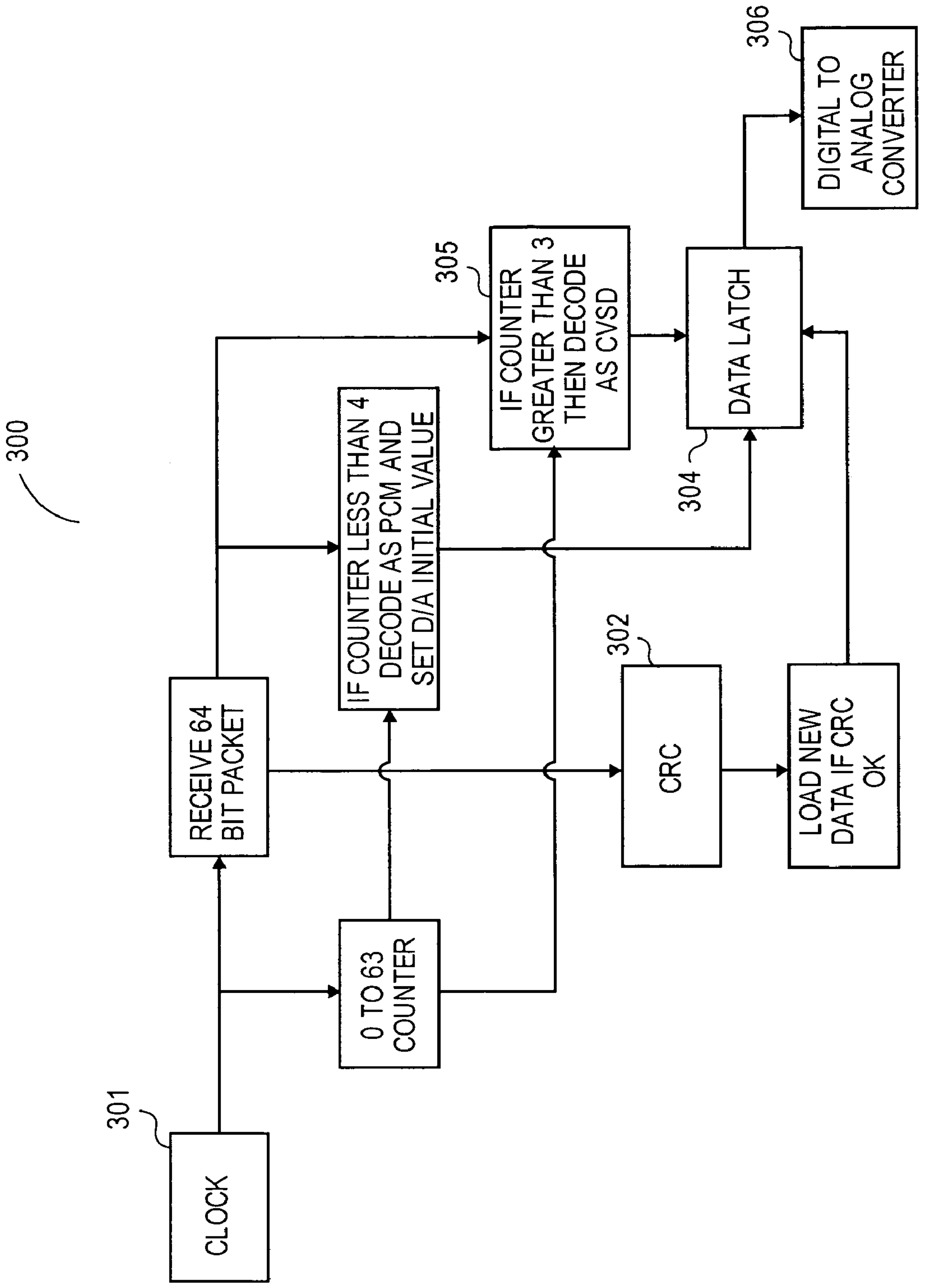
FIG. 3 illustrates a functional block diagram of the receiver/decoder for decoding an encoded packet in accordance with an embodiment of the present invention.

FIG. 3 illustrates a functional block diagram of the receiver/decoder for decoding an encoded packet in accordance with an embodiment of the present invention in which the system employs a 64-bit packet, with four initial bits encoded as PCM. At the receiver each packet is decoded independently using the initial PCM-encoded bits to define the starting value rather than the end value from the preceding packet.

The system 300, shown in FIG. 3 provides a clock signal to a received packet and a counter at operational block 301. An error detection process (e.g., cyclic redundancy check (CRC)) is performed at operational block 302. In the event that a received packet contains multiple errors, as determined by the CRC, the packet is discarded and the previous packet repeated.

While the counter is less than four, the packet is decoded as PCM at operational block 303. That is, the first four bits are decoded as PCM and, provided the CRC is positive, the values are stored to a data latch at operational block 304, thus providing the initial value for the digital to analog converter.

At operational block 305, the remaining bits (i.e., bits 4 through 63) are decodes as CVSD. The CVSD-decoded values are used to increment/decrement the data latch and the data is input to a D/A converter at operational block 306.

Figure 4:
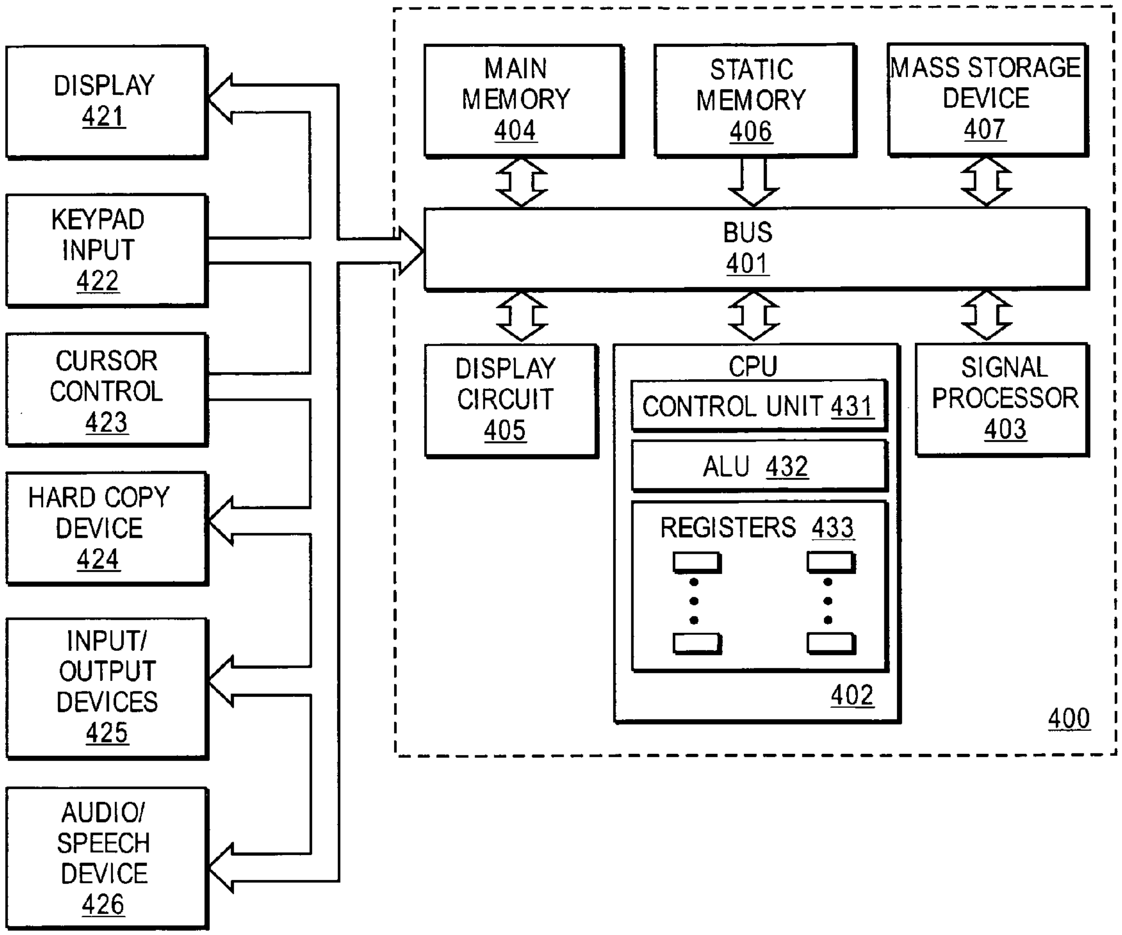
FIG. 4 is a diagram illustrating an exemplary processing system 400 for implementing an embodiment of the present invention.

FIG. 4 is a diagram illustrating an exemplary processing system 400 for implementing an embodiment of the present invention. The encoding and/or decoding of speech signals packets having a number of initial bits PCM-encoded and the remaining bits CVSD-encoded, as described herein, may be implemented and utilized within processing system 400, which may represent a general-purpose computer, portable or mobile computer, or other like device. The components of processing system 400 are exemplary in which one or more components may be omitted or added. For example, one or more memory devices may be utilized for processing system 400.

Referring to FIG. 4, processing system 400 includes a central processing unit 402 and a signal processor 403 coupled to a display circuit 405, main memory 404, static memory 406, and mass storage device 407 via bus 401. Processing system 400 may also be coupled to a display 421, keypad input 422, cursor control 423, hard copy device 424, input/output (I/O) devices 425, and audio/speech device 426 via bus 401.

Bus 401 is a standard system bus for communicating information and signals. CPU 402 and signal processor 403 are processing units for processing system 400. CPU 402 or signal processor 403 or both may be used to process information and/or signals for processing system 400. CPU 402 includes a control unit 431, an arithmetic logic unit (ALU) 432, and several registers 433, which are used to process information and signals. Signal processor 403 may also include similar components as CPU 402.

Main memory 404 may be, e.g., a random access memory (RAM) or some other dynamic storage device, for storing information or instructions (program code), which are used by CPU 402 or signal processor 403. Main memory 404 may store temporary variables or other intermediate information during execution of instructions by CPU 402 or signal processor 403. Static memory 406, may be, e.g., a read only memory (ROM) and/or other static storage devices, for storing information or instructions, which may also be used by CPU 402 or signal processor 403. Mass storage device 407 may be, e.g., a hard or floppy disk drive or optical disk drive, for storing information or instructions for processing system 400.

Display 421 may be, e.g., a cathode ray tube (CRT) or liquid crystal display (LCD). Display device 421 displays information or graphics to a user. Processing system 400 may interface with display 421 via display circuit 405. Keypad input 422 is an alphanumeric input device with an analog to digital converter. Cursor control 423 may be, e.g., a mouse, a trackball, or cursor direction keys, for controlling movement of an object on display 421. Hard copy device 424 may be, e.g., a laser printer, for printing information on paper, film, or some other like medium. A number of input/output devices 425 may be coupled to processing system 400. The process of encoding a number of bits of a speech transmission packet using PCM encoding the remaining bits of the packet using CVSD encoding, as well as the process of decoding packets thusly encoded, in accordance with one embodiment of the present invention, may be implemented by hardware and/or software contained within processing system 400. For example, CPU 402 or signal processor 403 may execute code or instructions stored in a machine-readable medium, e.g., main memory 404.

The machine-readable medium may include a mechanism that provides (i.e., stores and/or transmits) information in a form readable by a machine such as computer or digital processing device. For example, a machine-readable medium may include a read only memory (ROM), random access memory (RAM), magnetic disk storage media, optical storage media, flash memory devices. The code or instructions may be represented by carrier-wave signals, infrared signals, digital signals, and by other like signals.

An embodiment of the invention optimally combines distinct encoding techniques to compensate for burst errors without incurring high transmission overhead. Error extension on frequency hopping radio circuits is minimized so that speech is less subject to distortion and noise burst when packets are lost as a result of collisions between frequency hopping radio devices or outside interference.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method comprising:
- encoding a first portion of a signal using a first encoding technique, the first portion of the signal encoded as a first number of bits;
- encoding a second portion of the signal using a second encoding technique, the second portion of the signal encoded as a second number of bits, wherein the first encoding technique is pulse code modulation and the second encoding technique is continuously variable slope delta modulation; and
- creating a transmission packet having initial bits and remaining bits wherein the initial bits are the first number of bits and the remaining bits are the second number of bits, and wherein the initial bits are sufficient to establish a starting value of the signal at the beginning of the transmission packet.

2. The method of claim 1, wherein the signal is an analog speech signal and the transmission packet is a speech transmission packet.

3. The method of claim 2, wherein the speech transmission packet has 64 bits and the first number of bits is three bits.

4. A method comprising:
- receiving a transmission packet having a plurality of bits, a first number of bits representing an encoded first portion of a signal encoded using a first encoding technique, and a second number of bits representing an encoded second portion of the signal encoded using a second encoding technique, the transmission packet having initial bits and remaining bits wherein the initial bits are the first number of bits and the remaining bits are the second number of bits, and wherein the initial bits are sufficient to establish a starting value of the signal at the beginning of the transmission packet;
- decoding the first number of bits in accordance with the first encoding technique; and
- decoding the second number of bits in accordance with the second encoding technique, wherein the first encoding technique is pulse code modulation and the second encoding technique is continuously variable slope delta modulation.

5. The method of claim 4, wherein the signal is an analog speech signal and the transmission packet is a speech transmission packet.

6. The method of claim 5, wherein the first number of bits is sufficient to establish the value of the analog speech signal.

7. The method of claim 5, wherein the speech transmission packet has 64 bits and the first number of bits is three bits.

8. A machine-readable medium that provides executable instructions, which when executed by a processor, cause the processor to perform a method comprising:
- encoding a first portion of a signal using a first encoding technique, the first portion of the signal encoded as a first number of bits;
- encoding a second portion of the signal using a second encoding technique the second portion of the signal encoded as a second number of bits, wherein the first encoding technique is pulse code modulation and the second encoding technique is continuously variable slope delta modulation; and
- creating a transmission packet having initial bits and remaining bits wherein the initial bits are the first number of bits and the remaining bits are the second number of bits, and wherein the initial bits are sufficient to establish a starting value of the signal at the beginning of the transmission packet.

9. The machine-readable medium of claim 8, wherein the signal is an analog speech signal and the transmission packet is a speech transmission packet.

10. The machine-readable medium of claim 9, wherein the speech transmission packet has 64 bits and the first number of bits is three bits.

11. A machine-readable medium that provides executable instructions, which when executed by a processor, cause the processor to perform a method comprising:
- receiving a transmission packet having a plurality of bits, a first number of bits representing an encoded first portion of a signal encoded using a first encoding technique, and a second number of bits representing an encoded second portion of the signal encoded using a second encoding technique, the transmission packet having initial bits and remaining bits wherein the initial bits are the first number of bits and the remaining bits are the second number of bits, and wherein the initial bits are sufficient to establish a starting value of the signal at the beginning of the transmission packet;

decoding the first number of bits in accordance with the first encoding technique; and decoding the second number of bits in accordance with the second encoding technique, wherein the first encoding technique is pulse code modulation and the second encoding technique is continuously variable slope delta modulation.

12. The machine-readable medium of claim 11, wherein the signal is an analog speech signal and the transmission packet is a speech transmission packet.

13. The machine-readable medium of claim 12, wherein the first number of bits is sufficient to establish the value of the analog speech signal.

14. The machine-readable medium of claim 12, wherein the speech transmission packet has 64 bits and the first number of bits is three bits.

15. A method comprising:

receiving a transmission packet having a plurality of bits, a first number of bits representing an encoded first portion of a signal encoded using a first encoding technique, and a second number of bits representing an encoded second portion of the signal encoded using a second encoding technique, the transmission packet having initial bits and remaining bits wherein the initial bits are the first number of bits and the remaining bits are the second number of bits, and wherein the initial bits are sufficient to establish a starting value of the signal at the beginning of the transmission packet;

decoding the first number of bits in accordance with the first encoding technique; and decoding the second number of bits in accordance with the second encoding technique.

16. The method of claim 15, wherein the signal is an analog speech signal and the transmission packet is a speech transmission packet.

17. The method of claim 16, wherein the speech transmission packet has 64 bits and the first number of bits is three bits.

18. A machine-readable medium that provides executable instructions, which when executed by a processor, cause the processor to perform a method comprising:

receiving a transmission packet having a plurality of bits, a first number of bits representing an encoded first portion of a signal encoded using a first encoding technique, and a second number of bits representing an encoded second portion of the signal encoded using a second encoding technique, the transmission packet having initial bits and remaining bits wherein the initial bits are the first number of bits and the remaining bits are the second number of bits, and wherein the initial bits are sufficient to establish a starting value of the signal at the beginning of the transmission packet;

decoding the first number of bits in accordance with the first encoding technique; and decoding the second number of bits in accordance with the second encoding technique.

19. The machine-readable medium of claim 18, wherein the signal is an analog speech signal and the transmission packet is a speech transmission packet.

20. The machine-readable medium of claim 19, wherein the speech transmission packet has 64 bits and the first number of bits is three bits.

* * * * *

UNITED STATES PATENT AND TRADEMARK OFFICE

CERTIFICATE OF CORRECTION

PATENT NO. : 7,096,180 B2
APPLICATION NO. : 10/146866
DATED : August 22, 2006
INVENTOR(S) : Waltho It is certified that error appears in the above-identified patent and that said Letters Patent is hereby corrected as shown below:

In column 1, at line 61, delete “bust” and insert --burst--.
In column 1, at line 62, after “packet” insert --of--.
In column 2, at line 3, delete “established” and inset --reestablished--.
In column 2, at line 11, delete “is”.

Signed and Sealed this

Sixth Day of November, 2007

JON W. DUDAS
*Director of the United States Patent and Trademark Office*